United States Patent [19]

Douglas

[11] Patent Number: 5,431,774
[45] Date of Patent: Jul. 11, 1995

[54] COPPER ETCHING

[75] Inventor: Monte A. Douglas, Coppell, Tex.

[73] Assignee: Texas Instruments Incorporated, Dallas, Tex.

[21] Appl. No.: 277,534

[22] Filed: Jul. 19, 1994

Related U.S. Application Data

[63] Continuation of Ser. No. 159,636, Nov. 30, 1993, abandoned.

[51] Int. Cl.$^6$ .............................. B44C 1/22; C23F 1/00
[52] U.S. Cl. ..................................... 216/57; 252/79.1; 216/65; 216/67; 216/107
[58] Field of Search ............... 156/635, 643, 646, 656, 156/666, 345, 901, 902; 252/79.1; 204/192.35; 437/245

[56] References Cited

U.S. PATENT DOCUMENTS

| | | | |
|---|---|---|---|
| 4,490,211 | 12/1984 | Chen et al. | 156/643 |
| 5,085,731 | 2/1992 | Norman et al. | 156/646 |
| 5,098,516 | 3/1992 | Norman et al. | 156/646 |

Primary Examiner—William Powell
Attorney, Agent, or Firm—Carlton H. Hoel; Richard A. Stoltz; Richard L. Donaldson

[57] ABSTRACT

A dry etch for metals such as copper using $\pi$-acids in an energetic environment such as a plasma, laser, or afterglow reactor (102) or by using ligands forming volatiles at low temperature within a pulsed energetic environment.

15 Claims, 2 Drawing Sheets

COPPER ETCHING

This application is a Continuation of application Ser. No. 08/159,636, filed Nov. 30, 1993, now abandoned.

BACKGROUND OF THE INVENTION

The invention relates to electronic devices, and, more particularly, to formation of metal (such as copper and copper alloy) structures useful in integrated circuits and printed wiring boards.

A steady demand for increasing performance in the electronics industry has driven integrated circuit technology to faster operation and more densely packed circuits. This translates to smaller devices and smaller propagation delays. In particular, the cross section of conductive interconnections among devices decreases with circuit downsizing, but an increase in their resistance and stray capacitance will degrade propagation delay times. This has led to the replacement of polysilicon interconnections with more conductive materials such as silicided polysilicon, aluminum, and tungsten. Indeed, aluminum alloy interconnections for top metal level is industry standard; but large current densities used in small cross sectional aluminum interconnections leads to electromigration, stress migration, and voiding where aluminum alloy lines become fractured or otherwise degraded during operation. Further, metal interconnections must provide low resistance to avoid propagation delay due to the increasingly dominant influence of RC delays in circuit performance at sub half micron line widths. Currently, aluminum in the form of roughly 2% copper (to enhance electromigration resistance) has a resistivity of about 3–4 $\mu$ohm-cm. Tungsten has good electromigration resistance but has a resistivity of about 5.4 $\mu$ohm-cm. In contrast, copper has good electromigration resistance and a resistivity of about 1.7 $\mu$ohm-cm.

Despite the advantages of copper with respect to resistivity and electromigration, it has not been widely used in integrated circuits due to factors such as (i) copper forms a deep level acceptor in silicon which will reduce minority carrier lifetime, (ii) copper will react with silicon dioxide to form copper oxide and silicon at high temperatures, (iii) copper has a high diffusion coefficient in silicon dioxide, and (iv) the lack of a suitable copper dry etch process. However, advances in diffusion barriers such as TiN and low temperature deposition of copper has alleviated problems (i)–(iii), but finding a suitable etch remains a problem.

The development of low temperature deposition of copper by chemical vapor deposition (CVD) includes approaches to selective deposition of copper, and the deposition reactions run in reverse possibily provide etches. For example, Jain et al, Control of Selectivity During Chemical Vapor Deposition of Copper from Copper (I) Compounds via Silicon Dioxide Surface Modification, 61 Appl. Phys. Lett. 2662 (1992), discloses selective CVD of copper from a disproportionation reaction such as

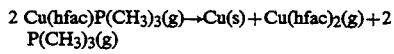

where hfac is 1,1,1,5,5,5-hexafluoroacetylacetonate. The copper in the lefthand portion of the equation is cuprous (+1 valence) and the copper on the righthand side is copper metal and cupric (+2 valence). The trimethylphosphine is an adducted Lewis base, and both oxygens in the hfac bond to the copper. Recall that the coordination number of copper is most commonly 4 for cuprous and 4 or 6 for cupric. U.S. Pat. Nos. 5,098,516 and 5,221,366 disclose the foregoing and other deposition and etching of copper with diketone compounds.

In general, seven methods have been or are used to pattern thick copper films: (1) plasma etch processing of blanket copper films, in most instances using a chlorine-based etch chemistry, (2) ion milling or magnetron etching blanket copper films with an argon or chlorine reagent, (3) wet chemical etching blanket copper films with ferric chloride or nitric acid, (4) dry etching blanket copper films with activated gaseous reagents such as hfac or other organic radicals, (5) selective CVD of copper as described in the preceding paragraph, (6) selectively electroplating a copper film on predisposed conductor regions, and (7) metal lift-off. These approaches have problems for small linewidths as follows. Plasma etching has generally failed due to the lack of a copper halide with reasonable vapor pressure at 50°–100° C. Higher temperatures lead to particle contamination in cold wall reactors and the etch exhibits significant isotropy.

Ion milling or magnetron etching with argon or chlorine boils down to a mere sputter removal of the copper film, and this redeposits on the reacator walls, leading to particulate contamination and device damage.

Wet etching of copper films works well at large feature sizes, but wet etches severely undercut the copper film with respect to a masking layer. Small feature sizes cannot tolerate the isotropy or the contamination introduced by wet chemicals.

Dry etching with gaseous reagents falls into different classes. A first class introduces plasma activated organic radicals, such as methyl redicals, to react with copper to form a solid or a gas product that is removed either by a wet solution or by evolution from the surface as a vapor. However, the organic precursors can polymerize in an energetic etch chamber and contaminate the reactor and the copper surface, terminating the reaction with copper. A second class introduces ligands, such as the hfac and trimethylphosphine previously described, to react with copper forming volatiles which then evaporate from the surface. That is, the preceding deposition reaction may be run in reverse by passing Cu(hfac)$_2$ and P(CH$_3$)$_3$ over the copper to be etched. A third class intially chlorinates the copper to be etch to form CuCl$_x$ and then passes P(C$_2$H$_5$)$_3$ over the CuCl$_x$ to form CuCl(P(C$_2$H$_5$)$_3$)$_2$ which vaporizes in a low pressure chamber. See Farkas et al, Low-Temperature Copper Etching via Reactions with Cl$_2$ and PEt$_3$ under Ultrahigh Vacuum Conditions, 73 J. Appl. Phys. 1455 (1993). Such processes tend to be isotropic and may require high temperatures to increase volatility. The vapor pressure of these copper ligand products are low at room temperature. The ligands are fairly complex molecules that are easily fragmented and rendered useless as etch reagents in an energetic (e.g., plasma, afterglow, . . . ) dry etch chamber.

Selective copper CVD and selective copper electroplating both require a seed layer, and this seed layer itself may require etching to create the pattern. Again practical etching of copper is lacking. Lastly, copper lift-off has limited use at submicron feature sizes with dense patterns.

Thus the formation of patterned copper films has problems such as small feature etching including isotropy.

Plasma etching of silicon can be enhanced through time modulation of the plasma or of the etching gasses. For example, Boswell et al, Etching in a Pulsed Plasma, 62 J. Appl. Phys. 3123 (1987), describes silicon etching with $SF_6$ and pulsed RF power having a 20% duty cycle and pulse durations down to 1 ms. The etch rate rise time when the plasma is excited was about 2 ms, and the etch rate decay time when the plasma was extinguished was about 50 ms. Similarly, McNevin, Radio Frequency Plasma Etching of $Si/SiO_2$ by $Cl_2/O_2$: Improvements Resulting from the Time Modulation of the Processing Gases, 9 J. Vac. Sci. Tech. A 816 (1991), describes pulsing the oxygen in a chlorine/oxygen etch of silicon with oxygen pulses as short as 60 ms in a parallel plate etcher with a gas residence time of only 25 ms.

SUMMARY OF THE INVENTION

The present invention provides an anisotropic dry etch of metals such as copper by use of robust $\pi$-acids such as halogenated phosphine reagents and/or pulsed energetic environments. The etch removes the metal in the form of volatiles at low temperatures.

BRIEF DESCRIPTION OF THE DRAWINGS

The drawings are schematic for clarity.

DESCRIPTION OF THE PREFERRED EMBODIMENTS

$PF_5$ Etching

Figure 1:
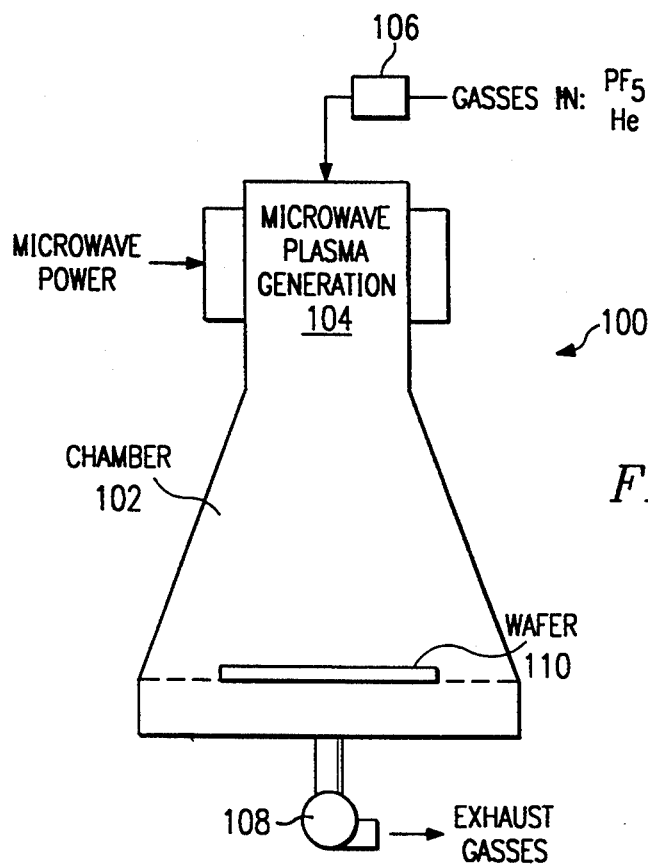
FIG. 1 shows a first preferred embodiment etch system.

FIG. 1 heuristically shows in cross sectional elevation view first preferred embodiment copper etch system, generally denoted by reference numeral 100, as including afterglow reactor chamber 102 containing microwave plasma generation region 104 together with mass flow controller 106 for introducing gasses ($PF_5$ and He in FIG. 1) into region 104 and high vacuum exhaust pump 108 and a wafer holder to hold copper-coated wafer 110. Exhaust pump 108 maintains the pressure in chamber 102 at about 50 mTorr (although pressures in the range of roughly 3–1000 mTorr (about 0.4–133 Pa) could be used with various other conditions). Flow controller 106 introduces $PF_5$ plus diluent helium into region 104 where a microwave induced plasma activates the $PF_5$ into higher electronic energy levels and produces fragments such as activated $PF_3$ and F plus ions such as $F^+$ and $PF_3^+$.

The effluent of activated $PF_5$, $PF_3$, and F and diluent from activation region 104 impinges wafer 110. Activated neutral F reacts with exposed copper on the surface of wafer 110 (the portion of copper to be preserved on the surface of wafer 110 will be protected by an etch mask such as patterned photoresist) to yield $CuF_x$. The $PF_3$ adductively bonds to the Cu in CuF to form $CuF(PF_3)_3$ or $CuF(PF_3)_4$ type compounds which should have a vapor pressure of roughly 100–1000 mTorr at 50°–100° C. Similarly, $CuF_2(PF_3)_4$ type complexes could be formed and have a high vapor pressure. The larger the coordination number for the copper, the larger the vapor pressure should be due to the shielding of the copper and consequent deterrence of oligomerization of $CuF_x$. Note that CuF and $CuF_2$ both have very low vapor pressures at room temperature.

The bombardment of wafer 110 by the impinging molecules and fragments heats it but the wafer temperature is controlled by cooling water circulated through the wafer holder and typically holds the temperature to about 50°–100° C. The vapor pressure of some $CuF(PF_3)_x$ type compounds should greatly exceed the ambient pressure in chamber 102, and $CuF(PF_3)_x$ readily evaporates from the copper surface to be exhausted by pump 108 and thereby etch the exposed copper. The copper etch may be made somewhat anisotropic by lowering the chamber pressure so that the distance from activation plasma region 104 to wafer 110 is comparable to the mean free path of a typical ion. In such a case the directionality of the effluent impinging wafer 110 will increase the etch rate vertically due to the directional surface activation by chemical or reactive ion bombardment. For a chamber pressure of 10 mTorr the mean free path equals roughly 4.3 mm.

Variations of the $PF_5$ embodiment include adding either $F_2$ and/or $PF_3$ to the input gasses in order to balance the fluorination and complexing reaction rates. Indeed, the use of $F_2$ and $PF_3$ in place of $PF_5$ and with plasma activation (dissociation) of only $F_2$ allows for greater control of the etch process with a tradeoff of more involved gas input.

Copper Trifluorophosphine Complexes

The first preferred embodiment method of etching copper relies on formation of copper complexes with trifluorophosphine. Copper in the cuprous state, Cu(I), most frequently has a coordination number of four with a tetrahedral geometry, and copper in the cupric state, Cu(II), most commonly has a coordination number of either four (distorted tetrahedral or square geometry) or six (distorted octahedral geometry). Trifluorophosphine is a Lewis base with a tetrahedral structure having a central phosphorus atom and fluorine atoms at three vertices plus a pair of electrons in a 3 sp orbital of phosphorus at the fourth vertex plus unoccupied 3 d orbitals of phosphorus. Thus $PF_3$ can bond to metals such as Cu(I) by a $\sigma$ bond from donation of the 3 sp electron pair of the phosphorus to the unoccupied 4 s level of Cu(I) and a $\pi$ bond from backdonation of a filled 3 d level of Cu(I) to an empty 3 d phosphorus orbital. The electronegativity of the fluorines in $PF_3$ underlies this ability of $PF_3$ to accept the backdonated 3 d electrons from copper. Such backdonation acceptor characteristic classifies $PF_3$ as a $\pi$-acid.

Figure 2:
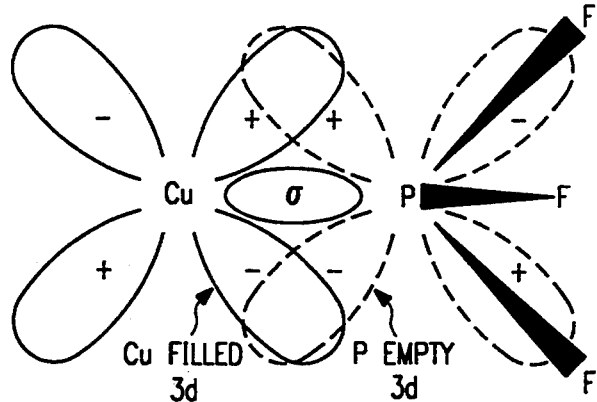
FIG. 2 illustrates a copper trifluorophosphine complex bond.
Figure 3A:
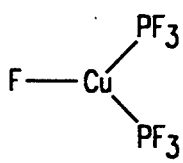
FIGS. 3a–d are structural diagrams of copper fluoride trifluorophosphine complexes of varying composition.
Figure 3B:
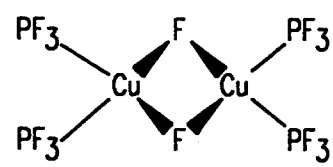
Figure 3C:
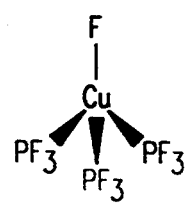
Figure 3D:
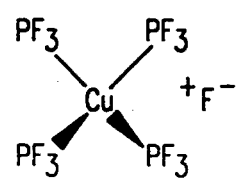

FIG. 2 heuristically illustrates such a Cu(I)—$PF_3$ bond, illustrating the $\sigma$ and $\pi$ bonds. FIGS. 3a–d illustrates various geometries for complexes: $CuF(PF_3)_2$, $[CuF(PF_3)_2]_2$, $CuF(PF_3)_3$, and $CuF(PF_3)_4$. Note that the protruding fluorine atoms provide a robustness against fragmentation despite the active species generated in plasma region 104.

$PF_3$ will adsorb on the surface of fluorinated copper plus also other surfaces such as silicon dioxide or photoresist. The sticking coefficient for adsorption on fluorinated copper should be fairly large due to the strong interaction of copper with a π-acid. The surface reactions basically are accumulation of two or more PF$_3$ molecules by a single copper atom followed by evaporation of the complex. Explicitly, $$CuF(s) + PF_3(g) \rightarrow CuF(PF_3)(s)$$

$$CuF(PF_3)(s) + PF_3(g) \rightarrow CuF(PF_3)_2(g)$$

$$CuF(PF_3)_2(s) + PF_3(g) \rightarrow CuF(PF_3)_3(g)$$

where (s) indicates on the surface and (g) indicates a gas. The complexing with PF$_3$ weakens the bonds of surface oligomerized copper fluoride, and the complexing is a stepwise reaction. Further, the stability and simple atomic composition of PF$_3$ suggests that it can withstand exposure to the energetic etch environment in a manner that does not render it useless as an etch reagent. Moreover, such etch reagents will not polymerize in the gas phase or on the etch surface, in contrast to the use of CF$_4$ or other carbon-based etch reagents. However, a passivating residue can form if the etch environment is inappropriately too energetic so as to unacceptably fragment or dissociate the etch reagents or the volatile copper complexes before they have an opportunity to react or to be removed from the etch chamber, respectively.

Plasma PF$_3$ etch

Figure 4:
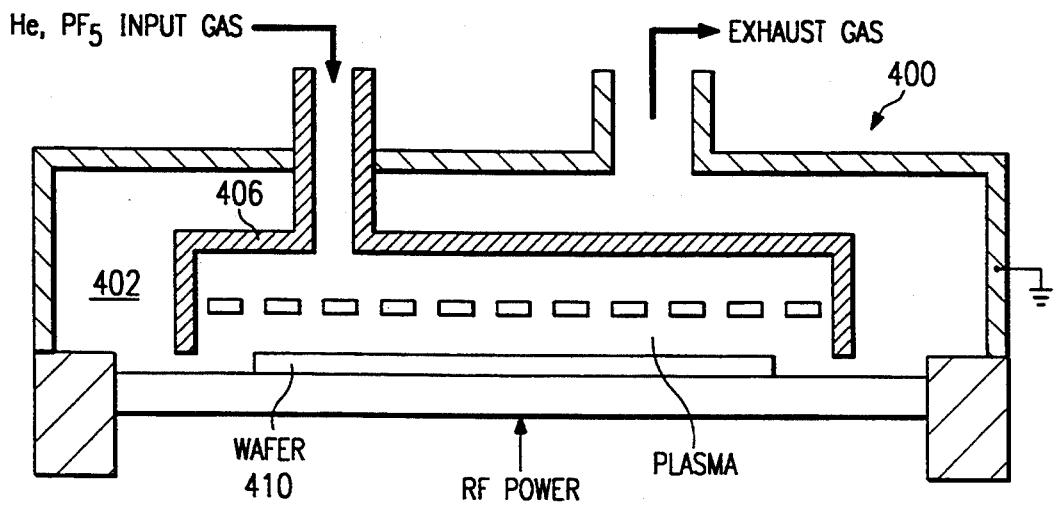
FIG. 4 shows a second preferred embodiment etch system.

FIG. 4 illustrates in cross sectional elevation view parallel plate plasma reactor 400 for a second preferred embodiment copper etch method. Wafer 410 in reactor 400 again has exposed copper to be etched. Again, introduce PF$_5$ and helium feed gasses into chamber 402 through shower head inlet manifold 406 and power the wafer holder (13.56 MHz) to create a plasma adjacent wafer 410. The exhaust pump maintains the pressure in chamber 402 at about 50 mTorr, and again the plasma excites the PF$_5$ and fragments it into PF$_3$ and F atoms plus various ions and electrons. Again, the F atoms fluorinate the exposed copper, and the PF$_3$ complexes with the CuF to form volatile products which evaporate from the surface and exit chamber 402 via the exhaust pump. The ion bombardment of wafer 410 provides for anisotropic etching. The tradeoff of ion bombardment is the potential fragmentation of the volatile etch products such as CuF(PF$_3$)$_2$ before they can be exhausted from chamber 402; this may result in redeposition of CuF, CuF$_2$, or copper on wafer 410. Of course, these exposed copper compounds will also be etched in the same fashion as the original copper; consequently, a small fragmentation and redeposition rate will not be significant.

Pulsed Plasma Etches

Figure 5:
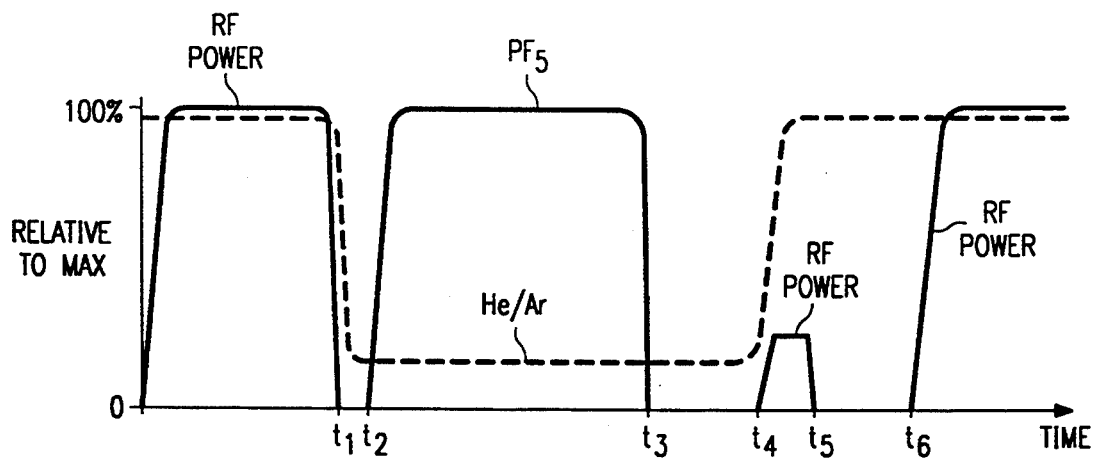
FIGS. 5–6 are timing diagrams for pulsed plasma etching.

The third preferred embodiment method of copper etching again uses the parallel plate plasma reactor illustrated in FIG. 4 but pulses the applied RF power. This permits evaporated species to exit the etch chamber without fragmentation in the plasma but still provides the surface activation by the plasma. This plasma pulsing may be performed with many variations. In particular, FIG. 5 shows the timing of RF power application and gas flows which proceeds as follows.

(a) Start a cycle (at time 0 in FIG. 5) with a helium or argon flow through the parallel plate reactor at a pressure of about 50 mTorr and turn on RF power (depending upon the reactor size) of 500 watts to excite a plasma in the helium or argon. The helium or argon plasma bombards the etch mask and the exposed copper surface on the wafer surface; this bombarment creates an activated copper surface with dangling bonds.

(b) At time t$_1$ (about 20 ms) turn off the RF power and the plasma extinguishes within 1 ms. Then at time t$_2$ (about 2 ms after t$_1$) introduce a PF$_5$ flow (the helium or argon flow may be reduced or abated) and maintain the total pressure of about 50 mTorr. The PF$_5$ adsorbs on, dissociates, and reacts with the activated copper surface to form species such as CuF, CuF(PF$_3$)$_x$, PF$_3$, F, and F$_2$. The volatile species evaporate from the surface, and the CuF(PF$_3$)$_x$ evaporation removes copper.

(c) At time t$_3$ (about 100 ms after t$_2$) stop the PF$_5$ flow, but continue any helium flow or restart a small helium flow to help sweep out evaporating species so that the total pressure in the reactor drops to about 10 mTorr. This pressure drop helps evaporation of CuF(PF$_3$)$_x$ type species at lower temperatures which may have vapor pressures only on the order of 50 mTorr at room temperature.

(d) Continue this quiescent evaporation interval until time t$_4$ (about 20 ms after t$_3$) and then increase the helium or argon flow to bring the chamber pressure back up to 50 mTorr and briefly (for 10 ms) turn on the RF power to excite a plasma (at a lower power level such as 300 watts) which essentially supplies a small burst of energy to cleanup residual evaporants from the copper/CuF surface. Turn off the RF power at time t$_5$ (10 ms after t$_4$) and let species evaporate from the surface and exit the chamber until time t$_6$ (about 20 ms after t$_5$). At time t$_6$ begin another cycle.

A complete cycle has a duration of about 170 ms, and thus removal of a single atomic layer of copper during a cycle will still yield an etch rate of roughly 70 nm/min. Of course, the time intervals could be changed with the recognition that 25-50 ms may be the residence time for species in the etch chamber. Also note that the residue activated by the plasma between t$_4$ and t$_5$ will not include sidewall residue, and this leads to anisotropic etching. Similarly, the surface activation by the plasma between 0 and t$_1$ also leads to anisotropic etching.

Figure 6:
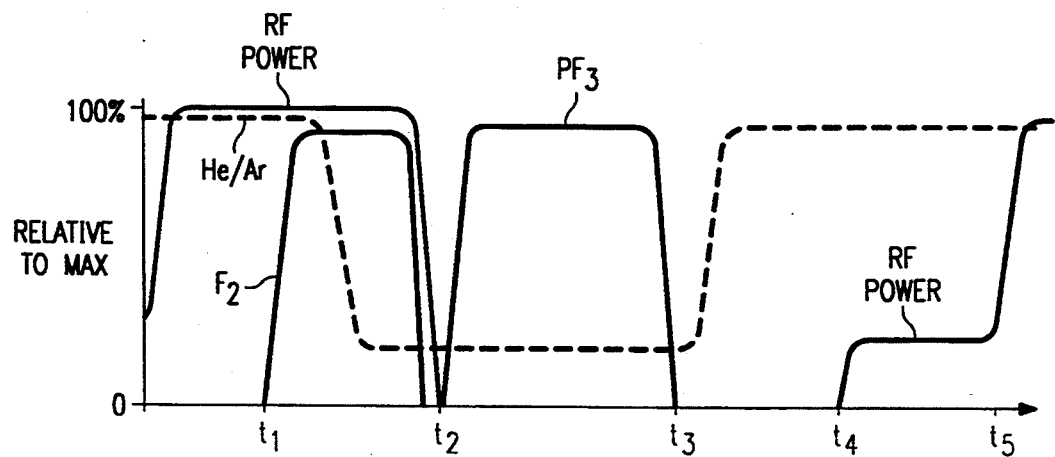

Variations of the pulsed plasma etch embodiment include: (1) starting the PF$_5$ flow prior to extinguishing the plasma (t$_2$ precedes t$_1$), this permits the plasma to initiate some dissociation and fragmentation of the PF$_5$ so surface dissocation need not be totally relied on; (2) using separate PF$_3$ and F$_2$ sources in place of PF$_5$ and introducing the F$_2$ into the plasma for dissociation to F atoms; (3) the low power plasma between times t$_4$ and t$_5$ to assist in evaporation could be omitted; and (4) the separate F$_2$ and PF$_3$ case could have the F$_2$ introduced during the activation plasma and the PF$_3$ introduced after extinguishing the plasma as illustrated in FIG. 6. In such a case the ligand (PF$_3$) does not experience the energetic environment of the surface activation and halogenation. Indeed, the full power plasma first activates the copper surface with helium/argon bombardment (time 0 to t$_1$) and then provides the fluroination by introduction of F$_2$ (time t$_1$ to t$_2$) along with a decrease in the helium/argon; then the plasma is extinguished and the ligand (π-acid) PF$_3$ is introduced (time t$_2$ to t$_3$)

followed by an increased helium/argon flow to help sweep out the volatiles (time $t_3$ to $t_4$); and lastly, a partial power gentle plasma is struck with the helium/argon to help dislodge volatiles from the surface (time $t_4$ to $t_5$) and then the cycle begins again. Thus the ligand only has exposure to the gentle plasma after a period of evaporation; this helps avoid dissociation and redeposition.

Pulsed Plasma with General Ligands

The pulsed plasma approach to copper etching may be adapted to the hfac or other ligand systems: alternate plasma activation of the copper surface and introduction of $Cu(hfac)_2$ plus $P(C_2H_5)_3$ which generates $Cu(hfac)P(C_2H_5)_3$ to etch the copper. Again, the timing of the plasma pulses (which may be on the order of 10 ms for a plasma with intense surface bombardment) and the etchant gas introduction (which may be on the order of 100–200 ms) will depend upon the etch chamber geometry and gas residence time. Note that the plasma activation of the copper surface yields an anisotropy missing from the plasmaless version. Similarly the other plasmaless systems indicated in the background may benefit from pulsed plasma activation and anisotropy. Further, larger, less robust ligands, such as $PR_3$ with R a alkyl or aromatic may be used because the energetic environment will not directly attack the ligands. Indeed, other Lewis bases such as $NH_3$ and $NF_3$ and $OH_2$ could be useful.

Photoactivation

The plasma activation of the previously described embodiments could be replaced with photoactivation, such as a laser with emission in the range of about 150 nm to 1500 nm. Particular laser frequencies may be resonantly absorbed by $PF_5$ or $PF_3$ and $F_2$ to generate the species for etching, and copper (or CuF) photoabsorption for surface activation may also occur in this frequency range. Again, the activation source may be pulsed on the millisecond time scale to avoid the activation disrupting evaporating species. With lasers beams perpendicular to the wafer surface, anisotropic etching may be obtained.

Halogen Substitutions

Further preferred embodiment methods of copper etching follow the previously described preferred embodiment methods but rely upon halogenated phosphines and phosphoranes other than just trifluorophosphine and pentaflurorphosphorane. In particular, halogenated phosphoranes such as $PF_3Cl_2$, $PFCl_3Br$, $PFClI_3$ in place of $PF_5$, and halogenated phosphines, PXYZ where X, Y, and Z are each a halogen, in place of $PF_3$ may be used alone or in mixtures. Again, the plasma or laser activates the halogenated phosphoranes and phosphines, and they complex with the copper surface. Complexes such as $CuCl(PF_3)(PFClBr)$ and $CuF(PF_2Cl)(PClBr_2)(PF_3)_2$ should have vapor pressures up to on the order of 1000 mTorr at 100° C., depending upon molecular weight, and will evaporate to etch a copper surface. And partially halogenated phosphines and phosphoranes, such as $PHF_2$ or $PHF_4$, could be used, although the phosphorus-hydrogen bond lacks the robustness of the phosphorus-halogen bond and will not be as stable in an energetic environment such as a plasma, and hydrogen does not have the electronegativity of halogens to enhance $\pi$-acidity. Indeed, $PH_3$ is not a $\pi$-acid. However, copper hydrides complexes such $CuH(PF_3)_4$ should have a very high vapor pressure.

Thus even the introduction of hydrogen such as HCl or HF along with the $\pi$-acid may be useful and provide the halogenation of the copper.

The increasing molecule weight of the copper complexes with the higher weight halogens and halogenated phosphoranes and phosphines suggests that fluoro and chloro derivatives will have the greatest vapor pressures, although the higher halogens and halogenated phosphoranes and phosphines may provide lower activation energies and less energetic plasmas or lasers and simpler anisotropic etching by sidewall passivation. Thus with a pulsed energy approach, a chlorination with HCl to CuCl followed by $PF_3$ $\pi$-acid introduction with gentler or no energy input may efficiently etch copper by production of volatiles such as $CuCl(PF_3)_4$.

Other $\pi$-acids

Other $\pi$-acids which could be used in place of $PF_3$ or the other halophosphines include carbon monoxide (CO), nitric oxide (NO), dinitrogen ($N_2$), carbon monosulfide (the CS molecule cannot be isolated, but precursors such as $CS_2$ may be used), arsines ($AsX_3$ where X is electronegative such as F, Cl, ...), stibines ($SbX_3$ where X is electronegative), $SX_2$ and $SeX_2$ (X electronegative), and isocyanides (CNR with R a radical). These are all (except for isocyanides) small robust ligands which should survive an energetic environment without adverse effects. Except with the arsines and stibines, an additional halogenating (or hydriding) source to oxidize the copper must be introduced along with the $\pi$-acid (precursor). And halogenation may be avoided with some of these compounds which can oxidize various metals.

Other Metals

The fourth preferred embodiment method of etching applies one of the first three embodiments to metals other than copper. Indeed, copper alloys contain small amounts of other metals which also must be removed; and diffusion barriers may also be deposited with copper and it would be convenient to be able to etch them with the same process as the copper etch. In particular, nickel and platinum form complexes in the zero oxidation state with halogenated phosphine, such as $Ni(PF_3)$, and $Pt(PF_3)_4$, which have high vapor pressures at room temperature and may be etched as with the copper of the first three embodiments but without the need for halogenation. In fact, the pulsed energy activation with helium/argon followed by $PF_3$ introduction may suffice. Generally, metals having d level electrons available for backdonation ($\pi$) bonding, such as the transition metals, bind with $\pi$-acids generally and may form complexes in low oxidation states which have high volatility and thus are etched as with the preferred embodiments. And the $\pi$-acids used may include mixtures. For example, $ReCl(PF_3)_5$ has a vapor pressure of about 10 mTorr at 20° C., $Co(NO)(PF_3)_3$ has a boiling point a little above 80° C., and $Fe(NO)_2(PF_3)_2$ has a boiling point about 100° C.

The use of pulsed plasma activation permits use of less robust ligands and thus volatiles such as $Mo(CH_2ClPF_2)_3(CO)_4$ with a vapor pressure of 50 mTorr at 127° C., $Co(PF_3)_2(C_5H_5)$ with a vapor pressure of 13 Torr at 51° C., and $IrH(PF_3)_4$ with a boiling point of about 100° C. are examples for the pulsed energy approach.

Silicides may also be etched with many of the preferred embodiments because halogens form volatile silicon compounds.

Modifications and Advantages

The preferred embodiments may be varied in many ways while retaining one or more of the features of $\pi$-acid reaction with copper halides or other metals for anisotropic etching and pulsed energetic etch environments for etching with metal ligands which may dissociate in an energetic etch environment.

For example, the etch conditions may be varied (pressure, plasma generation, flow rates, ...), including with the pulsed plasma omitting or combining some of the steps such as for the process of FIG. 6 the activation and halogenation could be a single plasma with $F_2$ (with or without an additional inert gas), the gentle plasma could be omitted or immediately follow the liganding by $PF_3$ or less robust ligand. The case of mixtures of ligands could have staggered ligand introduction, such as a robust ligand (e.g., $PF_3$) could be introduced during plasma activation and a less robust ligand ($PAr_3$ where Ar is an aromatic) introduced subsequent to extinguishing the plasma.

The invention provides an advantage of anisotropic copper and other metal etching without relying upon volatile halides.

What is claimed is:

1. A method of etching, comprising the steps of:
   (a) providing a body with exposed metallic material on a surface;
   (b) flowing a $\pi$-acid over said surface; and
   (c) removing volatile compounds of said metallic material from said surface.

2. The method of claim 1, wherein:
   (a) said metallic material is copper.

3. The method of claim 1, comprising the further step of:
   (a) prior to said step (c) of claim 1, halogenating said exposed metallic material.

4. The method of claim 1, further comprising the step of:
   (a) providing an energetic environment at said surface, said energetic environment is an afterglow.

5. The method of claim 1, further comprising the step of:
   (a) providing an energetic environment at said surface, said energetic environment is a plasma.

6. The method of claim 1, further comprising the step of:
   (a) providing an energetic environment at said surface, said energetic environment is laser illumination.

7. The method of claim 1, wherein:
   (a) said x-acid is a halogenated phosphorus compound.

8. The method of claim 7, wherein:
   (a) said $\pi$-acid is $PF_3$.

9. The method of claim 7, wherein:
   (a) said $\pi$-acid is $PF_5$.

10. The method of claim 1, further comprising the step of:
    (a) providing an energetic environment at said surface, said energetic environment pulses.

11. A method of etching, comprising the steps of:
    (a) providing a body with exposed metallic material on a surface;
    (b) providing a pulsing energetic environment at said surface;
    (c) flowing a ligand for at least a component of said metallic material over said surface; and
    (d) removing volatile compounds from said surface.

12. The method of claim 11, wherein:
    (a) said metallic material is copper.

13. The method of claim 11, wherein:
    (a) said flowing of said step (c) of claim 1 pulses with a maximum of said flowing occurring during a minimum of said pulsing energetic environment.

14. The method of claim 13, comprising the further step of:
    (a) prior to said maximum of said step (a) of claim 13, halogenating said metallic material.

15. The method of claim 11, wherein:
    (a) said ligand is a $\pi$-acid.

* * * * *